United States Patent
Lee et al.

(10) Patent No.: US 10,606,135 B2
(45) Date of Patent: Mar. 31, 2020

(54) LIQUID CRYSTAL PANEL, METHOD FOR FABRICATING THEREOF AND DISPLAY APPARATUS

(71) Applicant: HUIZHOU CHINA STAR OPTOELECTRONICS TECHNOLOGY CO., LTD., Huizhou Guangdong (CN)

(72) Inventors: Yung-jui Lee, Huizhou Guangdong (CN); Chengwen Que, Huizhou Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 21 days.

(21) Appl. No.: 15/994,437

(22) Filed: May 31, 2018

(65) Prior Publication Data

US 2019/0204669 A1   Jul. 4, 2019

Related U.S. Application Data

(63) Continuation of application No. PCT/CN2018/073091, filed on Jan. 17, 2018.

(30) Foreign Application Priority Data

Dec. 29, 2017 (CN) .......................... 2017 1 1480164

(51) Int. Cl.
*G02F 1/1345* (2006.01)
*H01L 23/498* (2006.01)
(Continued)

(52) U.S. Cl.
CPC ........ *G02F 1/13452* (2013.01); *G02F 1/1339* (2013.01); *H01L 23/498* (2013.01);
(Continued)

(58) Field of Classification Search
CPC .. G02F 1/1345; G02F 1/13452; G02F 1/1339; G02F 2001/13398; H01L 23/498;
(Continued)

(56) References Cited

U.S. PATENT DOCUMENTS

2004/0046909 A1*  3/2004  Sekiguchi ............. G02F 1/1345
                                                        349/113
2017/0048977 A1*  2/2017  Siddique ................ H05K 3/323
(Continued)

FOREIGN PATENT DOCUMENTS

CN      106200159 A      12/2016
CN      106896599 A       6/2017
(Continued)

OTHER PUBLICATIONS

English translation of CN107121854 downloaded from WIPO at https://patentscope.wipo.int on Aug. 14, 2019; translation from Chinese to English provided by Google translate tool on site. (Year: 2017).*

*Primary Examiner* — Angela K Davison
(74) *Attorney, Agent, or Firm* — Hemisphere Law, PLLC; Zhigang Ma

(57) ABSTRACT

The present invention discloses a liquid crystal panel, includes a color filter substrate, an array substrate, a liquid crystal disposed between the color filter substrate and the array substrate, a chip on film, a driver chip and a circuit board disposed on the chip on film, one end of the chip on film is bonded to an end face of the array substrate and is electrically connected with a metal line array in the array substrate, the other end of the chip on film is bound with the circuit board. The invention also discloses a method for fabricating a liquid crystal panel and a display apparatus. When applying signal to the liquid crystal panel, the chip on film is bonded to the end face of the array substrate to realize
(Continued)

the conduction of the metal line array avoiding the longer bonding region extended from a side of the TFT substrate.

9 Claims, 4 Drawing Sheets

(51) Int. Cl.
    *H01L 23/00*     (2006.01)
    *G02F 1/1339*     (2006.01)

(52) U.S. Cl.
    CPC .......... *H01L 23/4985* (2013.01); *H01L 24/50* (2013.01); *H01L 24/86* (2013.01); *G02F 1/1345* (2013.01); *G02F 2001/13398* (2013.01); *H01L 23/49805* (2013.01); *H01L 23/49861* (2013.01); *H01L 23/49883* (2013.01); *H01L 24/27* (2013.01); *H01L 24/31* (2013.01)

(58) Field of Classification Search
    CPC ........... H01L 23/4985; H01L 23/49861; H01L 23/49883; H01L 24/50; H01L 24/86; H01L 24/70; C09J 2203/318; C09J 2203/326; C09J 9/02; C09J 2201/602
    See application file for complete search history.

(56) References Cited

U.S. PATENT DOCUMENTS

2018/0196298 A1*   7/2018   Ueno ..................... G02F 1/1339
2019/0033645 A1*   1/2019   Zhang ................. G02F 1/13452

FOREIGN PATENT DOCUMENTS

| | | |
|---|---|---|
| CN | 107121854 A | 9/2017 |
| CN | 107238964 A | 10/2017 |
| CN | 107247355 A | 10/2017 |
| CN | 107315272 A | 11/2017 |
| CN | 107402466 A | 11/2017 |
| CN | 107505785 A | 12/2017 |
| KR | 10-2007-0056780 A | 6/2007 |
| KR | 20080059836 A | 7/2008 |

* cited by examiner

LIQUID CRYSTAL PANEL, METHOD FOR FABRICATING THEREOF AND DISPLAY APPARATUS

RELATED APPLICATIONS

This application is a continuation application of PCT Patent Application No. PCT/CN2018/073091, filed Jan. 17, 2018, which claims the priority benefit of Chinese Patent Application No. 201711480164.9, filed Dec. 29, 2017, which is herein incorporated by reference in its entirety.

FIELD OF THE DISCLOSURE

The disclosure relates to a liquid crystal display technology field, and more particularly to a liquid crystal panel, a method for fabricating thereof and a display apparatus.

BACKGROUND

Chip on film, COF, that is, to fix an integrated chip, IC on a chip soft film of a flexible circuit board, FPC, in many display panels such as LCD, OLED, etc., this package technology chip is need to be used. This type of chip is used as a source driver and a gate driver of a display driver. In the driving circuit, one end of the COF is connected to a printed circuit board, PCB, and is responsible for receiving data signals transmitted from the printed circuit board. The other end of the COF is connected to a display panel for transmitting data signals output from the ICs to the display panel, to drive the display panel for performing display Specifically, the connection between the COF and the printed circuit board and the display panel is accomplished through a bonding process. During the fabricating of the liquid crystal display, LCD, for the need of driving the liquid crystal, it is necessary to reserve the bonding position of the driving circuit. Conventionally, a thin film transistor, TFT substrate with a circuit is made larger than a color filter, CF substrate of an upper layer (usually larger than 1 mm) to expose the required bonding position of the lines, in order to reserve the bonding position of the driving lines, an outer bezel is needed to be disposed to cover the bonding region, so as not to be seen by the user and affect the appearance of the display.

In recent years, with the continuous development of LCD display industry, panel appearance has a trend to be gradually narrowing. For example, the narrow bezel TV is to narrow the edge of the non-display area, the bezel with a more concise, detailed shape, make the product more beautiful. Even the concept of a "bezel-less" panel is proposed. That is, the outer bezel of shielding the non-display area of the panel is removed, to achieve bezel-less display. However, since the bonding end of the TFT substrate is longer than the CF substrate, a special outer bezel needs to be reserved to cover the connection lines in the bonding region, affecting the narrow bezel, bezel-less display cannot be achieved.

SUMMARY

In view of the shortcomings of the conventional technology, the present invention provides a liquid crystal panel, a method for fabricating thereof and a display apparatus, to avoid a longer bonding region extending from the side of the TFT substrate to facilitate ultra-narrow bezel or bezel-less of the display apparatus.

In order to achieve the above object, the present invention adopts the following technical solutions:

A liquid crystal panel, including a color filter substrate, an array substrate, a liquid crystal disposed between the color filter substrate and the array substrate, a chip on film, a driver chip and a circuit board disposed on the chip on film, wherein an end of the chip on film is bonded to an end face of the array substrate, and is electrically connected to a metal line array in the array substrate, the other end of the chip on film is bonded to the circuit board.

As one of the embodiments, the color filter substrate is flush with the end face of the array substrate bonded with the chip on film, the chip on film is simultaneously bonded to the end faces of the color filter substrate and the array substrate.

As one of the embodiments, in the end face of the array substrate bonded with the chip on film, an end face of the color filter substrate protrudes from the end face of the array substrate and blocks the chip on film.

As one of the embodiments, a conductive adhesive layer is adhered between the end face of the array substrate and the chip on film, the conductive adhesive layer is electrically connected to the metal line array.

As one of the embodiments, a frame glue is enclosed in a periphery between the color filter substrate and the array substrate, conductive dots are formed on the end faces of the array substrate and the frame glue, the metal line array is led out to be electrically connected to the conductive dots, the conductive adhesive layer encapsulates the conductive dots therein.

Another object of the present invention is to provide a method for fabricating a liquid crystal panel, including:

Cutting a master plate to form a plurality of liquid crystal cells;

Forming conductive dots at an end of each liquid crystal cell provided with a metal line array to electrically connect the conductive dots with the metal line array;

Attaching a front polarizer and a rear polarizer on an upper surface and a lower surface of the liquid crystal cell, respectively; and Bonding a chip on film with a driver chip and a circuit board on an end face of the liquid crystal cell to connect the chip on film and the conductive dots.

As one of the embodiments, before the step of forming conductive dots at the end of each liquid crystal cell provided with the metal line array further includes: grinding an end surface of the end of the liquid crystal cell provided with the metal line array to improve the surface finish.

As one of the embodiments, when forming conductive dots at the end of each liquid crystal cell provided with the metal line array, silver paste is printed on the polished end surface of the liquid crystal cell to form dots pattern array, each of the silver dots is electrically connected to at least one metal line of the metal line array.

As one of the embodiments, when bonding the chip on film with the driver chip and the circuit board on the end face of the liquid crystal cell, a conductive adhesive layer is first disposed on the chip on film and the end face of the liquid crystal cell with the metal line array, and then bonding the conductive adhesive layer to the end face of the liquid crystal cell by using a hot-pressing way.

A further object of the present invention is to provide a display apparatus including a backlight module and the liquid crystal panel, wherein the backlight module is disposed at a side of the array substrate.

In the present invention, when the signal is applied to the liquid crystal panel, the chip on film is bonded to the end face of the array substrate by an end face bonding way, so as to realize the conduction of the metal line array in the array substrate, and avoid the longer bonding region extended from a side of the TFT substrate, and is conducive to achieve ultra-narrow bezel or bezel-less of the display apparatus.

DETAILED DESCRIPTION OF THE PREFERRED EMBODIMENTS

In order to make the objectives, technical solutions and advantages of the present invention more comprehensible, the present invention is further described in detail below with reference to the accompanying drawings and embodiments. It should be understood that the specific embodiments described herein are merely used to explain the present invention, and are not intended to limit the present invention.

Figure 1:
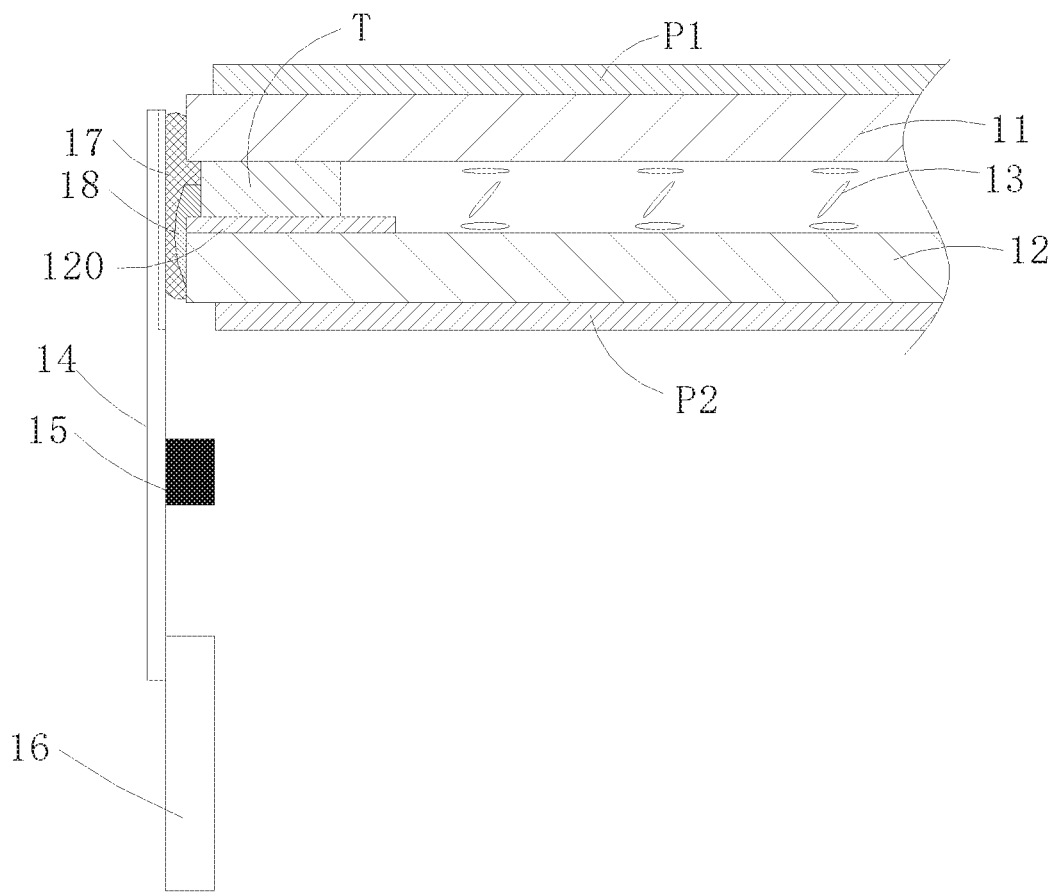
FIG. 1 is a schematic structural view of a liquid crystal panel according to an embodiment of the present invention.
Figure 2:
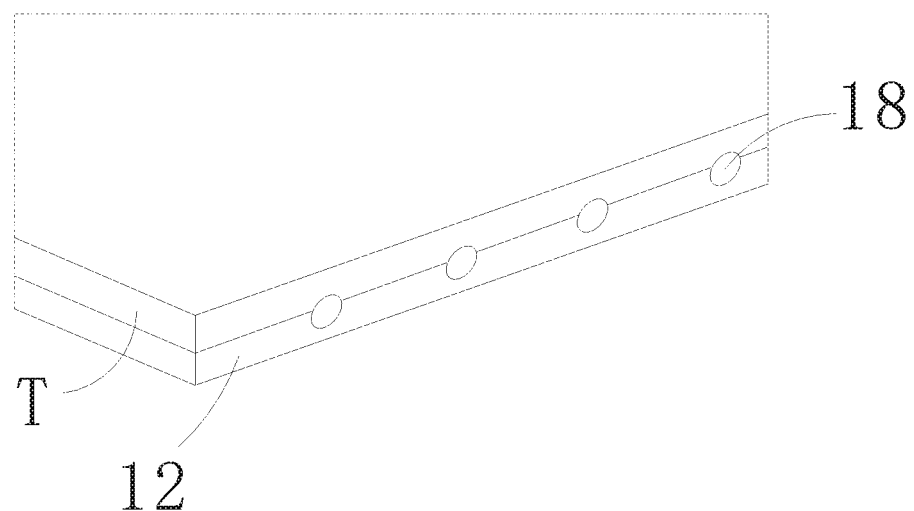
FIG. 2 is a schematic structural view of the conductive dots according to an embodiment of the present invention.
Figure 3:
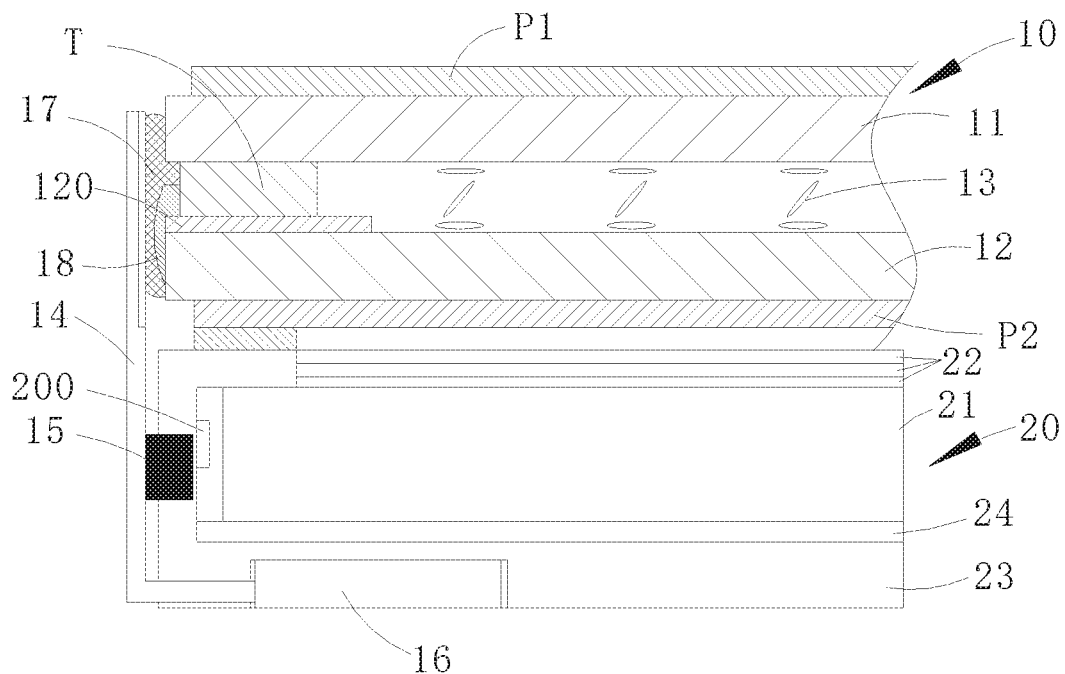
FIG. 3 is a schematic structural view of a display apparatus according to an embodiment of the present invention.

Referring to FIGS. 1 to 3, a display apparatus according to an embodiment of the present invention includes a liquid crystal panel 10 and a backlight module 20. The backlight module 20 is disposed on a side of an array substrate 12 of the liquid crystal panel 10. A side of disposing the color filter substrate 11 is a light emitting side. Outer surfaces of the color filter substrate 11 and the array substrate 12 are respectively bonded with a front polarizer P1 and a rear polarizer P2. Specifically, the liquid crystal panel mainly includes the color filter substrate 11, the array substrate 12, liquid crystal 13 disposed between the color filter substrate 11 and the array substrate 12, a chip on film 14, a driver chip 15 and a circuit board 16 disposed on the chip on film 14, an end of the chip on film 14 is bonded to an end face of the array substrate 12, and electrically connected to the metal line array 120 in the array substrate 12. The other end of the chip on film 14 is bonded to the circuit board 16. After the chip on film 14 is bended, the circuit board 16 is disposed on a back side of the array substrate 12.

The color filter substrate 11 is flush with the end face of the array substrate 12 bonded with the chip on film 14, the chip on film 14 is simultaneously bonded to the end faces of the color filter substrate 11 and the array substrate 12, so that the liquid crystal panel has a flush end face. A conductive adhesive layer 17 is adhered between the end face of the array substrate 12 and the chip on film 14. The conductive adhesive layer 17 is electrically connected to the metal line array 120. A frame glue T is enclosed in a periphery between the color filter substrate 11 and the array substrate 12. The frame glue T encapsulates the liquid crystal 13 between the color filter substrate 11 and the array substrate 12 to prevent moisture from entering. Conductive dots 18 are formed on the end faces of the array substrate 12 and the frame glue T, the metal line array 120 in the frame glue T of the array substrate 12 is led out to be electrically connected to the conductive dots 18, the conductive adhesive layer 17 encapsulates the conductive dots 18 therein, at the same time, the chip on film 14 is adhered to the end faces of the array substrate 12, the frame glue T, and the color filter substrate 11 through the conductive adhesive layer 17.

In this embodiment, the conductive adhesive layer 17 is an anisotropic conductive film, ACF adhesive, the conductive dot 18 is a material with good electrical conductivity such as Ag.

Figure 4:
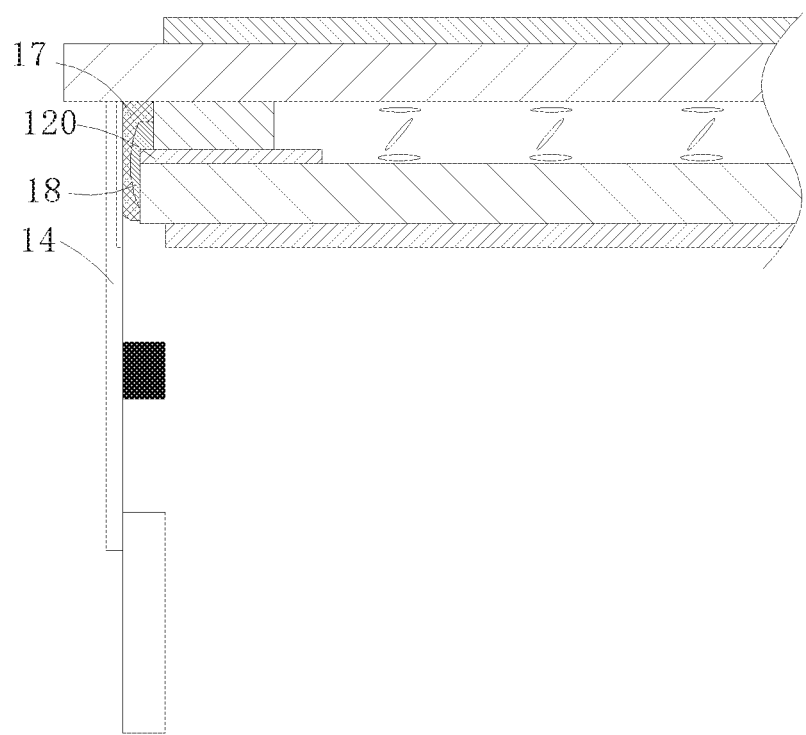
FIG. 4 is a schematic structural view of another liquid crystal panel according to an embodiment of the present invention.

As shown in FIG. 4, in another embodiment, one end of the array substrate 12 bonded with the chip on film 14, the width of the color filter substrate 11 is larger than the width of the array substrate 12, that is the end face of the color filter substrate 11 protrudes from the end face of the array substrate 12, the conductive adhesive layer 17 adheres only to the end faces of the array substrate 12 and the frame glue T, the chip on film 14 is attached to a surface of the conductive adhesive layer 17, the color filter substrate 11 is shielded above the chip on film 14, it is possible to prevent the chip on film 14 from being exposed and require additional design of the bezel structure to block it.

As shown in FIG. 3, in the display apparatus of the present embodiment, the backlight module 20 includes a light guide plate 21, an optical film set 22 disposed on the upper surface of the light guide plate, and a backplane 23. The backplane 23 includes a bottom surface portion for carrying the light guide plate 21, a side surface portion for fixing the light source 200, and a top surface portion for carrying the liquid crystal panel 10. The optical film set 22 is disposed on the light guide plate 21, and its end face is abutted to an end face of the top surface portion of the backplane 23, the liquid crystal panel 10 is attached to the top surface portion of the backplane 23 with a light-shielding adhesive. A reflective layer 24 may be further disposed between the bottom surface portion of the backplane 23 and the light guide plate 21. The reflective layer 24 is adhered to the bottom surface of the light guide plate 21 and extends to abut against the side surface portion of the backplane 23, so that the light projected from the light source 200 can be reflected back to the light guide plate, a bottom of the bottom surface portion of the backplane 23 may also be provided with a bottom recess portion for accommodating the chip on film 14 and the circuit board 16, a side portion of the backplane 23 may also be provided with a side recess portion for embedding the driver chip 15, so that the backplane 23 serves as both a fixing and a heat sink of the light source 200, as well as an accommodating element of the chip on film 14, the driver chip 15 and the circuit board 16, making the structure of the display apparatus more compact.

Figure 5:
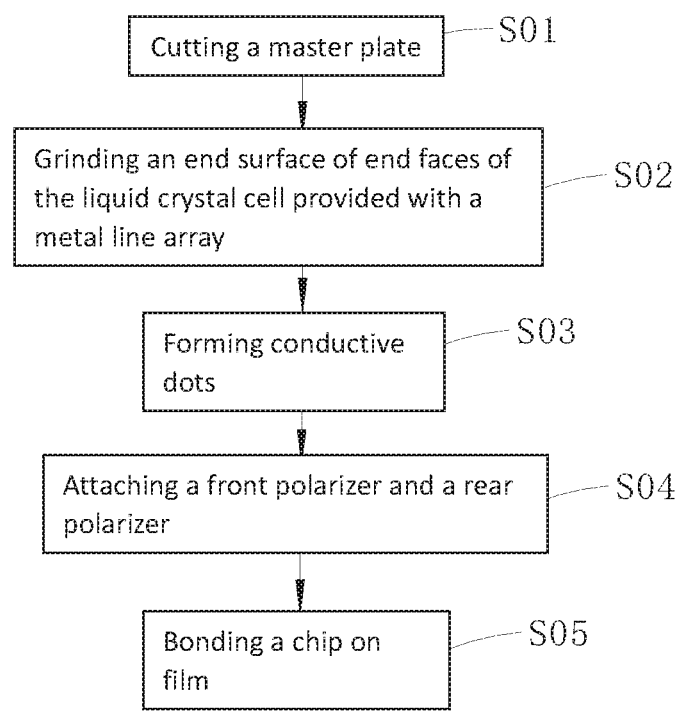
FIG. 5 is a schematic diagram of a method for fabricating a liquid crystal panel according to an embodiment of the present invention.
Figure 6:
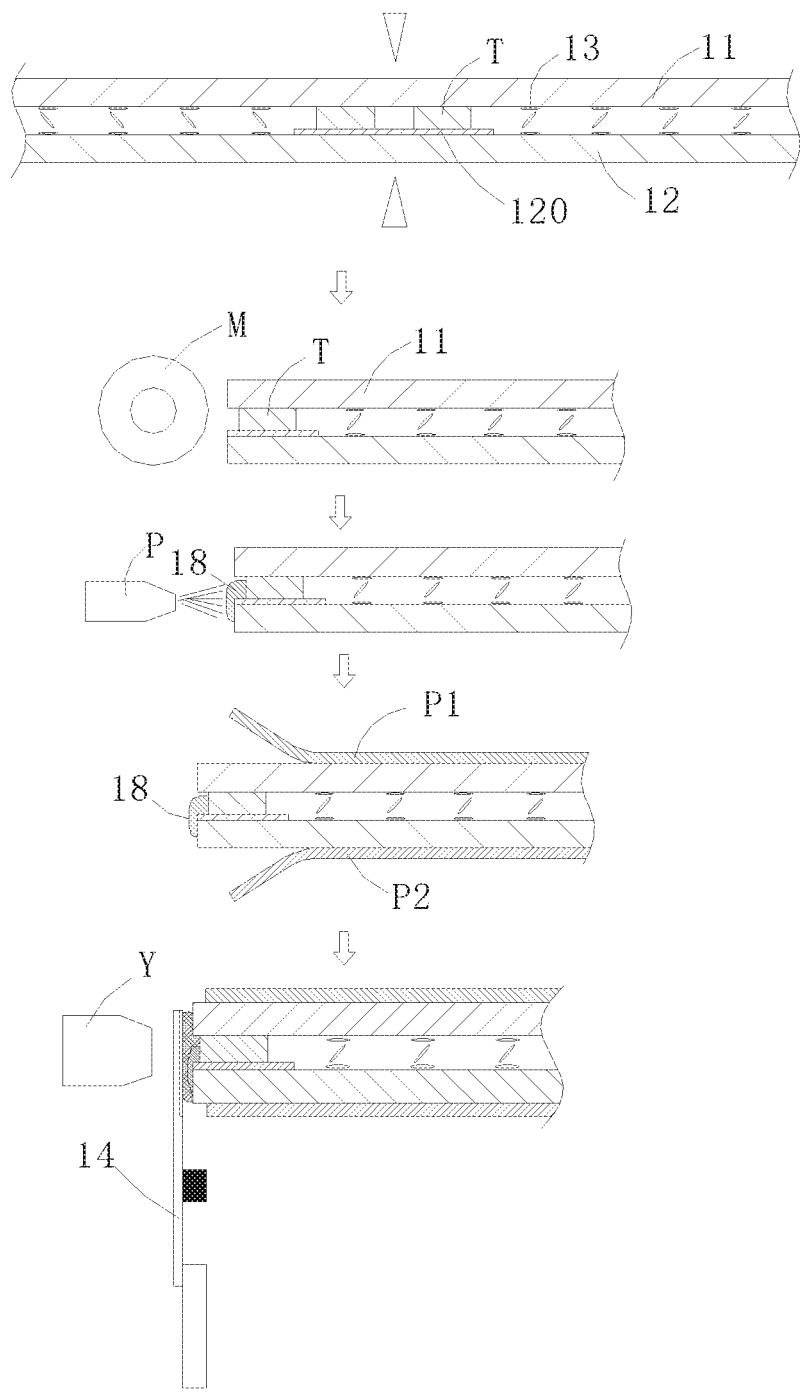
FIG. 6 is a fabricating process diagram of a liquid crystal panel according to an embodiment of the present invention.

As shown in FIGS. 5 and 6, the present invention also provides a method for fabricating a liquid crystal panel, including:

S01: cutting a master plate to form a plurality of liquid crystal cells;

S02: grinding an end surface of ends of the liquid crystal cell provided with a metal line array 120 by a grinding device M to improve the surface finish;

S03: forming conductive dots 18 at the end of each liquid crystal cell provided with the metal line array 120 to make the conductive dots 18 electrically connected with the metal line array 120; specifically, silver paste is printed on the polished end surface of the liquid crystal cell by the showerhead P, to form dots pattern array, each of the silver dots is electrically connected to at least one metal line of the metal line array 120, to realize multi-channel signal access.

By spraying force of the jet-printing, the silver glue droplets are penetrated a gap of the gel glue T and the array substrate 12 when adhering to the end face of the panel homeopathically, and can be better connected with the metal wire terminal disposed on the array substrate 12.

S04: attaching a front polarizer P1 and a rear polarizer P2 on the upper surface and the lower surface of the liquid crystal cell, respectively;

S05: bonding a chip on film 14 with a driver chip 15 and a circuit board 16 on an end face of the liquid crystal cell, to make the chip on film 14 and the conductive dots 18 to be conducted. When bonding the chip on film 14 with the driver chip 15 and the circuit board 16 on the end face of the liquid crystal cell, a conductive adhesive layer 17 is first disposed at one end of the chip on film 14 and one end face of the liquid crystal cell with the metal line array 120, and then bonding the conductive adhesive layer 17 to the end face of the liquid crystal cell in a thermal head Y by using a hot pressing way, to ensure a good electrical connection between the chip on film 14 and the liquid crystal cell.

In the cut liquid crystal cell, each of the color filter substrate 11 is flush with the end face of the array substrate 12 with the chip on film 14, the chip on film 14 is simultaneously attached to the end faces of the color filter substrate 11 and the array substrate 12. The conductive adhesive layer 17 is attached to the end faces of the array substrate 12, the frame glue T, and the color filter substrate 11. Alternatively, the end face of the color filter substrate 11 protrudes from the end face of the array substrate 12, the conductive adhesive layer 17 adheres only to the end faces of the array substrate 12 and the frame glue T, the chip on film 14 adheres to the surface of the conductive adhesive layer 17, the color filter substrate 11 is shielded above the chip on film 14.

In the present invention, when the signal is applied to the liquid crystal panel, the chip on film is bonded to the end face of the array substrate by an end face bonding way, so as to realize the conduction of the metal line array in the array substrate, and avoid the longer bonding region extended from a side of the TFT substrate, and is conducive to achieve ultra-narrow bezel or bezel-less of the display apparatus.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A liquid crystal panel, comprising: a color filter substrate, an array substrate, liquid crystal disposed between the color filter substrate and the array substrate, a chip on film, a driver chip and a circuit board disposed on the chip on film, wherein an end of the chip on film is bonded to an end face of the array substrate, and is electrically connected to a metal line array in the array substrate, another end of the chip on film is bonded to the circuit board;

wherein an end face of the color filter substrate protrudes past the end face of the array substrate to form a protrusion portion, and the chip on film is blocked by the protrusion portion of the color filter substrate.

2. The liquid crystal panel according to claim 1, wherein a conductive adhesive layer is adhered between the end face of the array substrate and the chip on film, the conductive adhesive layer is electrically connected to the metal line array.

3. The liquid crystal panel according to claim 2, wherein a frame glue is enclosed in a periphery between the color filter substrate and the array substrate, conductive dots are formed on the end faces of the array substrate and the frame glue, the metal line array is led out to be electrically connected to the conductive dots, the conductive adhesive layer encapsulates the conductive dots therein.

4. The liquid crystal panel according to claim 1, wherein a conductive adhesive layer is adhered between the end face of the array substrate and the chip on film, the conductive adhesive layer is electrically connected to the metal line array.

5. The liquid crystal panel according to claim 4, wherein a frame glue is enclosed in a periphery between the color filter substrate and the array substrate, conductive dots are formed on the end faces of the array substrate and the frame glue, the metal line array is led out to be electrically connected to the conductive dots, the conductive adhesive layer encapsulates the conductive dots therein.

6. A display apparatus, comprising a liquid crystal panel and a backlight module, the liquid crystal panel comprising a color filter substrate, an array substrate, liquid crystal disposed between the color filter substrate and the array substrate, a chip on film, a driver chip and a circuit board disposed on the chip on film, wherein an end of the chip on film is bonded to an end face of the array substrate, and is electrically connected to a metal line array in the array substrate, another end of the chip on film is bonded to the circuit board, and the backlight module is disposed on a side of the array substrate; wherein an end face of the color filter substrate protrudes past the end face of the array substrate to form a protrusion portion, and the chip on film is blocked by the protrusion portion of the color filter substrate.

7. The display apparatus according to claim 6, wherein a conductive adhesive layer is adhered between the end face of the array substrate and the chip on film, the conductive adhesive layer is electrically connected to the metal line array.

8. The display apparatus according to claim 7, wherein a frame glue is enclosed in a periphery between the color filter substrate and the array substrate, conductive dots are formed on the end faces of the array substrate and the frame glue, the metal line array is led out to be electrically connected to the conductive dots, the conductive adhesive layer encapsulates the conductive dots therein.

9. The display apparatus according to claim 6, wherein a conductive adhesive layer is adhered between the end face of the array substrate and the chip on film, the conductive adhesive layer is electrically connected to the metal line array, a frame glue is enclosed in a periphery between the color filter substrate and the array substrate, conductive dots are formed on the end faces of the array substrate and the frame glue, the metal line array is led out to be electrically connected to the conductive dots, the conductive adhesive layer encapsulates the conductive dots therein.

* * * * *